United States Patent [19]
Tihanyi

[11] Patent Number: 5,736,877
[45] Date of Patent: Apr. 7, 1998

[54] CIRCUIT CONFIGURATION FOR DETECTING IDLING OF A LOAD

[75] Inventor: Jenoe Tihanyi, Kirchheim, Germany

[73] Assignee: Siemens Aktiengesellschaft, Munich, Germany

[21] Appl. No.: 715,425

[22] Filed: Sep. 18, 1996

[30] Foreign Application Priority Data

Sep. 18, 1995 [DE] Germany .................. 195 34 603.3

[51] Int. Cl.⁶ .................. H03K 5/153; H03K 17/687
[52] U.S. Cl. .................. 327/77; 327/109; 327/427
[58] Field of Search .................. 327/108, 109, 327/427, 434, 435, 436, 538, 541, 543, 77

[56] References Cited

U.S. PATENT DOCUMENTS

| | | | |
|---|---|---|---|
| 4,980,576 | 12/1990 | Rossi et al. | 327/109 |
| 5,336,946 | 8/1994 | Segaram et al. | 327/65 |
| 5,576,648 | 11/1996 | Rossi et al. | 327/434 |

FOREIGN PATENT DOCUMENTS

| | | | |
|---|---|---|---|
| 37 12 177 A1 | 10/1988 | Germany | G05F 1/569 |
| 38 27 881 A1 | 2/1990 | Germany | H02H 3/00 |

*Primary Examiner*—Toan Tran
*Attorney, Agent, or Firm*—Herbert L. Lerner; Laurence A. Greenberg

[57] ABSTRACT

In power switches, reports should be issued frequently when the load becomes high in impedance and the load current drops below a predetermined value. In the idling case, however, the voltage drop at the power switch is very low and therefore can only be measured with some inaccuracy. Accurate detection of the reduction in the load current is possible, if a resistor is connected parallel, in the ON-state, to the load path of the power switch. The resistance of the resistor is greater by a multiple than the resistance of the internal resistor of the load path of the power switch. A comparator compares the voltage dropping at the load path of the power switch and therefore at the resistor with a predetermined reference voltage, and it signals the dropping of the load current below a value defined by the ratio of the reference voltage and the resistance of the resistor.

11 Claims, 1 Drawing Sheet

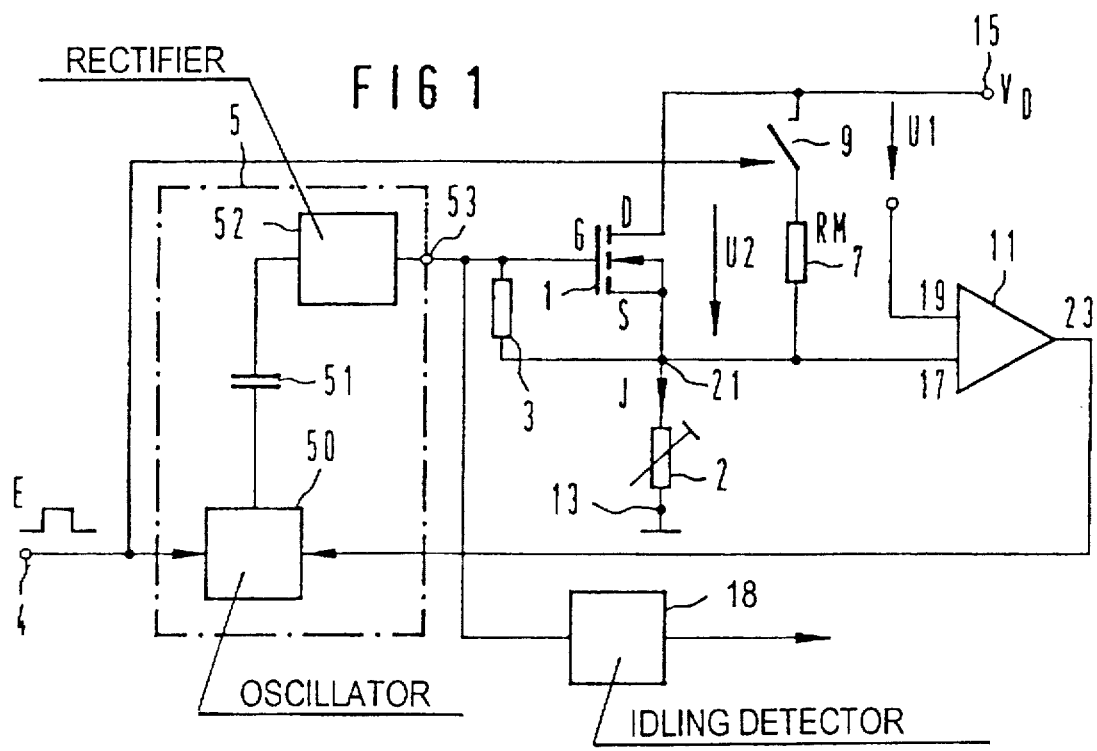
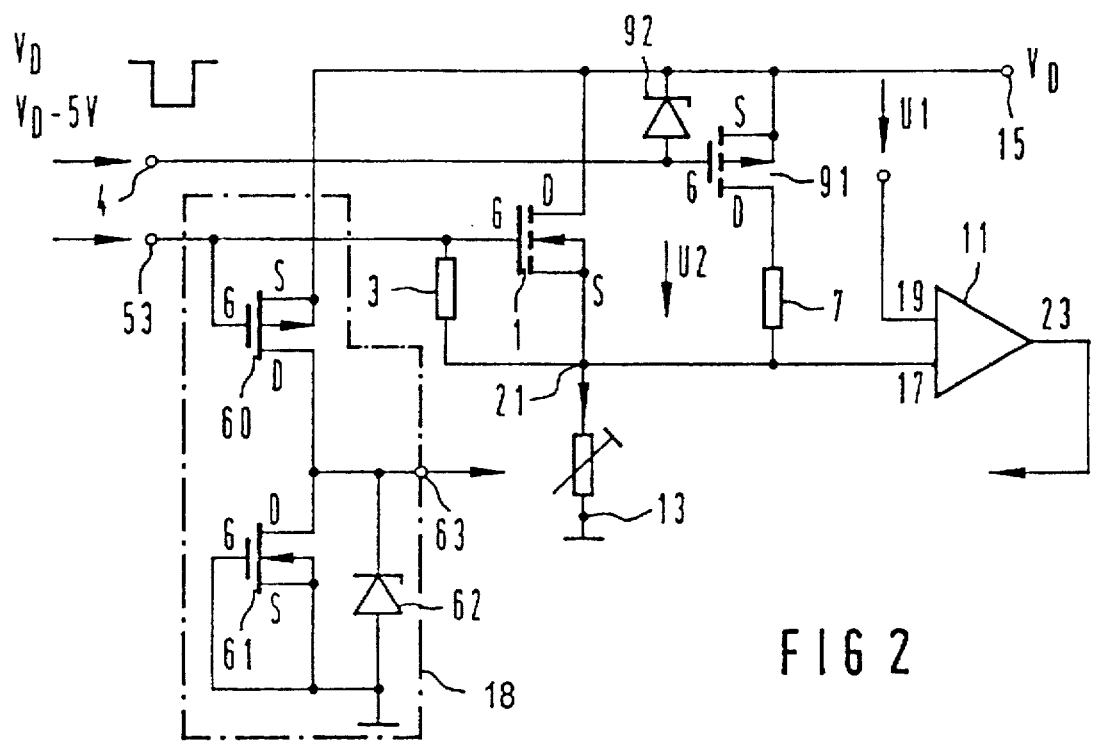

CIRCUIT CONFIGURATION FOR DETECTING IDLING OF A LOAD

BACKGROUND OF THE INVENTION

1. Field of the Invention

The present invention relates to a circuit configuration for detecting the idling of a load which is connected in series with an electronic power switch, having a comparator with an output side which signals the idling, a first input connected to a junction of the power switch and the load and a second input connected to a reference voltage which is less than a voltage dropping at the power switch at rated current and is greater than a voltage dropping at the power switch during idling.

For many applications, it is desirable to detect the dropout or failure of a load and to report as soon as the load current drops below a predetermined value. Since the load itself is often located at a distance from the power switch, monitoring of the voltage dropping at the load to detect the idling case is not an option, because of the additionally needed lines in that event.

In order to avoid having to measure the voltage drop at the load, it is already known to measure the voltage drop at the load path of the power switch. However, that value is extremely low, especially when a power MOSFET is used. In the idling case, or in other words with a high-impedance load, as in the case of a defective incandescent bulb, for instance, and with the power MOSFET on, the voltage drop in practice is approximately 1 to 10 mV, and therefore can be measured only with some imprecision. Moreover, that low voltage drop varies as a result of production variations.

A circuit configuration for detecting the idling of a load has already been described in Published European Patent Application 0,365,697 B1. The circuit configuration has a power MOSFET with a source-side load, and it has a comparator that signals the idling on the output side. The comparator compares the voltage dropping at the load path of the power MOSFET with a reference voltage, which is dimensioned in such a way that it is absolutely lower than the voltage that drops at the power MOSFET whenever the load is not interrupted, or in other words when rated current is flowing through the load, while on the other hand it is absolutely greater than the voltage that drops at the power MOSFET whenever the load is interrupted. A load dropout or failure creates a voltage discontinuity at the output of the comparator, which is evaluated as an indication for the idling of a load. In order to provide unequivocal ascertainment of the voltage dropping at the power MOSFET in the idling case, a current source must be connected parallel to the load. The current of the current source must be chosen to be smaller by multiple times than the load current in rated operation, or in other words when the load is intact.

A problem in that device is the necessity of using a current source connected parallel to the load. The current source increases the current consumption of the circuit configuration and assures a flow of current through the power MOSFET even in the idling case, thus causing power loss.

SUMMARY OF THE INVENTION

It is accordingly an object of the invention to provide a circuit configuration for detecting idling of a load, which overcomes the hereinafore-mentioned disadvantages of the heretofore-known devices of this general type, with which idling, or in other words an interruption of a load, can be detected even more accurately, in a simple way, without additional lines at a location remote from the load, and which has a current consumption that is markedly reduced.

With the foregoing and other objects in view there is provided, in accordance with the invention, a circuit configuration for detecting idling of a load, comprising an electronic power switch having an ON state and a load path with an internal resistor, the power switch being connected in series with a load at a junction; a comparator having a first input connected to the junction, a second input connected to a reference voltage being less than a voltage dropping at the power switch at rated current and greater than a voltage dropping at the power switch during idling, and an output for signaling idling of the load; and a resistor connected parallel to the load path of the power switch only in the ON-state of the power switch, the resistor having a higher resistance than the internal resistor of the load path of the power switch in the ON state thereof.

In accordance with another feature of the invention, the resistor to be switched parallel to the load path of the power switch is temperature-independent.

In accordance with a further feature of the invention, the resistor to be connected parallel to the load path of the power switch has a resistance being approximately 100 to 1000 times higher than the resistance of the load path of the power switch in the ON state thereof.

In accordance with an added feature of the invention, there is provided a charge pump to be controlled by an output signal of the comparator, the power switch being a MOSFET to be triggered by the charge pump and having gate and source terminals, and a discharge resistor connected between the gate and source terminals of the MOSFET.

In accordance with an additional feature of the invention, the charge pump includes a series circuit of a charge rectifier, a capacitor device and an oscillator to be turned on and off by the output signal of the comparator if a higher or lower voltage than the reference voltage is present at the first input of the comparator.

In accordance with yet another feature of the invention, the discharge resistor is a MOSFET with a resistance of approximately 100 k$\Omega$ to 10 m$\Omega$.

In accordance with yet a further feature of the invention, there is provided a detection device for detecting a gate potential at the gate terminal of the MOSFET and for signaling the idling of the load as soon as the gate potential has dropped below an inception voltage of the MOSFET.

In accordance with yet an added feature of the invention, the detection device has a series circuit of a first and a second complementary MOSFET connected between two terminals for a supply voltage, the first MOSFET having a gate terminal connected to the gate terminal of the power switch MOSFET, and the second MOSFET having a gate terminal connected to a reference potential terminal, and including a Zener diode connected parallel to a load path of the second MOSFET.

In accordance with yet an additional feature of the invention, there is provided a switch device connected in series with the resistor to be connected parallel to the load path of the power switch, for turning the switch device on and off simultaneously with the power switch.

In accordance with again another feature of the invention, the switch device and the resistor are integrated in the power switch.

In accordance with a concomitant feature of the invention, the switch device is a MOSFET.

Other features which are considered as characteristic for the invention are set forth in the appended claims.

Although the invention is illustrated and described herein as embodied in a circuit configuration for detecting idling of a load, it is nevertheless not intended to be limited to the details shown, since various modifications and structural changes may be made therein without departing from the spirit of the invention and within the scope and range of equivalents o of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic and block circuit diagram of an exemplary embodiment of the invention; and FIG. 2 is a schematic diagram of the circuit configuration shown in FIG. 1, with embodiments of individual circuit components.

DESCRIPTION OF THE PREFERRED EMBODIMENTS

Referring now to the figures of the drawings in detail and first, particularly, to FIG. 1 thereof, there is seen a circuit configuration that includes a power MOSFET 1, with which a load 2 is connected in series on the source side. The series circuit of the power MOSFET 1 and the load 2 is located between terminals 13 and 15, to which a supply voltage $V_D$ is applied. The supply potential $V_D$ is applied to the terminal 15, and a reference potential is applied to the terminal 13. A drain terminal D of the power MOSFET 1 is connected to the terminal 15, while a source terminal S and one terminal of the load 2 are connected to a common junction 21 of the series circuit. Another terminal of the load 2 is connected to the terminal 13. A gate terminal G of the power MOSFET 1 is triggered by a charge pump 5, which is known per se.

The charge pump 5 substantially includes a series circuit of an oscillator 50, a capacitive device 51 and a charge rectifier 52. The capacitive device 51 has one or more capacitors being connected in series between an output of the oscillator 50 and an input of the charge rectifier 52. The oscillator 50, that is the charge pump 5, can be activated by an input signal E. This input signal E, which in FIG. 1 can be applied to a terminal 4, serves to turn on the power MOSFET 1. The input signal E causes the oscillator 50 of the charge pump to be turned on, and as a result a potential that is elevated in comparison with the supply potential $V_D$ is present at an output terminal 53 of the charge pump 5. If the supply potential is +15 V, for instance, then when the charge pump is activated 25 V are present at the terminal 53, for instance, so that the power MOSFET 1 will reliably turn on. The gate potential at the gate terminal G of the power MOSFET 1 is thus supplied, in the ON state, with sufficient positive voltage from the charge pump 5. A discharge resistor 3 connected between the gate terminal G and the source terminal S of the power MOSFET 1 discharges the gate-to-source capacitance of the power MOSFET 1, as soon as the pumping operation of the charge pump 5 ceases, for instance from turnoff of the oscillator 50 because the input signal E has dropped to a low level.

The circuit configuration described thus far is known per se for triggering power MOSFETs with a source-side load.

In order to detect the idling of a load 2, the circuit configuration is expanded as follows. A series circuit of a switch device 9 and a preferably temperature-independent resistor 7 is connected parallel to the load path of the power MOSFET 1. The resistor 7 serves as a measuring resistor and has a higher resistance RM than does an internal resistor of the load path of the power MOSFET 1 in the ON state thereof. The resistance RM of the resistor 7 is preferably multiple times higher, for instance about 100 to 1000 times higher, than the resistance of the load path of the power MOSFET 1. The switch device 9 is triggered in such a way that the resistor 7 is connected parallel to the load path of the power MOSFET 1 precisely always whenever the power MOSFET 1, because of the input signal E at the terminal 4, is supposed to be in the ON state.

The circuit configuration in FIG. 1 also has a comparator 11, with a first input 17 and a second input 19. The first input 17 of the comparator 11 is connected to the junction 21 of the series circuit of the power MOSFET 1 and the load 2. The second input 19 is applied to a reference voltage U1. As is indicated by voltage arrows in FIG. 1, a voltage U2 that drops at the load path of the power MOSFET 1 and therefore also at the resistor 7 is thus present at the first input 17 of the comparator 11, while the second input 19 of the comparator 11 is acted upon, with regard to the supply potential $V_D$, by the reference voltage U1. An output 23 of the comparator 11 is provided to control the charge pump 5, so that the potential at the terminal 53 is variable. The change of potential at the terminal 53 of the charge pump 5 serves to vary the resistance of the load path of the power MOSFET 1, as long as the inception voltage of the power MOSFET 1 continues to be exceeded. The potential at the terminal 53 of the charge pump can be evaluated through a detection device to be described below.

In order to provide reliable detection of the idling of a load 2, it is necessary to select the reference voltage U1 in such a way that in normal operation, the pumping operation of the charge pump 5 is in full operation. This means that the oscillator 50 of the charge pump 5 must oscillate. To that end, the reference voltage U1 is chosen in such a way that on one hand it is lower than the potential which can be picked up at the junction 21 in the normal operating mode and on the other hand it is greater than the potential that can be picked up at the junction 21 during idling, with the potential in each case being referred to the supply potential $V_D$. The reference voltage U1 may, for instance, be 0.2 V. Thus the reference voltage U1 of 0.2 V is present between the terminal 15 and the second input 19 of the comparator 11. At an assumed supply voltage $V_D$ of +15 V, referred to the terminal 13 and therefore the reference potential, the terminal 19 is at 14.8 V. As long as the voltage U2 is higher than the reference voltage U1, the oscillator 50 operates as intended. Conversely, if the voltage U2 is less than the reference voltage U1, as happens in the idling case, the oscillator 50 of the charge pump 5 is not in operation. In rated operation, however, a load current I through the load 2 is so high that the voltage U2, as intended, is higher than the reference voltage U1, and as a result the charge pump operation remains full operation.

If the resistor of the load 2 comes to have high impedance, for instance as a consequence of the defect, then the load current I instantly begins to drop to zero, or nearly zero. The voltage U2 likewise begins to drop, and initially it approaches the value of the reference voltage U1, so that the potential at the output 23 of the comparator 11 is reduced. As a result, the gate potential of the power MOSFET 1 is reduced as well. The gate potential of the power MOSFET 1 will then swing back and forth until precisely the reference voltage U1 is established at the junction 21. If the load current I drops further, then the gate potential of the power MOSFET 1 is reduced further, specifically until in the end, the pumping operation has stopped entirely. The load current I is then no longer sufficient to attain the reference voltage U1 at the resistor 7. As a consequence, the output 23 of the comparator 11 reaches its "zero" level, and as a result the oscillator 50 of the charge pump 5 is turned off, despite the presence of the turn-on signal E at the terminal 4. The gate potential at the terminal 53 drops below the inception voltage, and the power MOSFET turns off.

A detection device 18 detects a state in which the gate potential of the power MOSFET 1 has dropped below the inception voltage. The detection device 18 detects, and indicates, that the load current I is less than its threshold value U1/RM. The current threshold to be evaluated for idling detection can thus be adjusted exactly through the use of the dimensioning of the voltage U1 and the resistance RM.

FIG. 2 shows features of individual components of the circuit configuration shown in FIG. 1. The detection device 18 has two depletion MOSFETs 60, 61 that are complementary to one another and connected in series. The MOSFET 60 is a p-channel MOSFET having a drain terminal D connected to the terminal 15 and thus to the supply potential $V_D$. A gate terminal G of this MOSFET 60 is connected to the gate terminal G of the power MOSFET 1. A source terminal S of the MOSFET 60 is connected to a drain terminal D of the n-channel MOSFET 61. The MOSFET 61 has a gate terminal G and a source terminal S which are connected to reference potential. A Zener diode 62 for voltage limitation is connected parallel to the load path of the MOSFET 61. A cathode terminal of the Zener diode 62 is connected to a junction of the two MOSFETs 60, 61. This junction at the same time forms an output terminal 63 of the detection device 18.

Detecting the gate potential in the present circuit configuration for the sake of idling detection offers the decisive advantage of permitting a relatively high voltage rise, which is easier to evaluate, to be utilized as a criterion for the idling detection.

The switch device 9 described in conjunction with FIG. 1 for connecting the resistor 7 parallel to the load path of the power MOSFET 1, can also be constructed as a MOSFET. As is shown in FIG. 2, a p-channel enhancement MOSFET 91 which is suitable for this purpose has a drain terminal D connected to the terminal 15 and a source terminal S connected to the resistor 7. A gate terminal G of this MOSFET 91 is acted upon by a signal that turns the MOSFET 91 on whenever the power MOSFET 1 is also to be turned on. To that end, the gate terminal G of the MOSFET 91 may, for instance, as shown in FIG. 2, by triggered with a signal at the terminal 4 that drops, in the ON situation, from the potential $V_D$ to the low level (for instance, $V_D$ −5 V). In addition, one further Zener diode 92 for voltage limitation is connected between the gate terminal G and the drain terminal D of the MOSFET 91. A cathode terminal of this Zener diode 92 is connected to the terminal 15.

According to a preferred feature of the invention, the resistor 7 and the MOSFET 91, optionally together with the Zener diode 92, can be integrated with the power MOSFET 1 on the same semiconductor substrate. The other components of the circuit configuration of the invention may also be constructed on such a semiconductor substrate. It is recommended that the discharge resistor 3 also be constructed as a MOSFET, for instance a depletion MOSFET. The discharge resistor 3 expediently has a very high-impedance internal resistor, such as 100 kΩ to 10 MΩ, so as to attain long time constants in the discharging process of the gate-to-source capacitance of the power MOSFET 1.

I claim:

1. A circuit configuration for detecting idling of a load, comprising:

an electronic power switch having an ON state and a load path with an internal resistor, said power switch being connected in series with a load at a junction;

a comparator having a first input connected to said junction, a second input connected to a reference voltage being less than a voltage dropping at said power switch at rated current and greater than a voltage dropping at said power switch during idling, and an output for signaling idling of the load; and a resistor connected parallel to the load path of said power switch only in the ON-state of said power switch, said resistor having a higher resistance than the internal resistor of the load path of said power switch in the ON state thereof.

2. The circuit configuration according to claim 1, wherein said resistor to be switched parallel to the load path of said power switch is temperature-independent.

3. The circuit configuration according to claim 1, wherein said resistor to be connected parallel to the load path of said power switch has a resistance being approximately 100 to 1000 times higher than the resistance of the load path of said power switch in the ON state thereof.

4. The circuit configuration according to claim 1, including a charge pump to be controlled by an output signal of said comparator, said power switch being a MOSFET to be triggered by said charge pump and having gate and source terminals, and a discharge resistor connected between the gate and source terminals of said MOSFET.

5. The circuit configuration according to claim 4, wherein said charge pump includes a series circuit of a charge rectifier, a capacitor device and an oscillator to be turned on and off by the output signal of said comparator if a higher or lower voltage than the reference voltage is present at the first input of said comparator.

6. The circuit configuration according to claim 4, wherein said discharge resistor is a MOSFET with a resistance of approximately 100 kΩ to 10 mΩ.

7. The circuit configuration according to claim 4, including a detection device for detecting a gate potential at the gate terminal of said MOSFET and for signaling the idling of the load as soon as the gate potential has dropped below an inception voltage of said MOSFET.

8. The circuit configuration according to claim 7, wherein said detection device has a series circuit of a first and a second complementary MOSFET connected between two terminals for a supply voltage, said first MOSFET having a gate terminal connected to the gate terminal of said power switch MOSFET, and said second MOSFET having a gate terminal connected to a reference potential terminal, and including a Zener diode connected parallel to a load path of said second MOSFET.

9. The circuit configuration according to claim 1, including a switch device connected in series with said resistor to be connected parallel to the load path of said power switch, for turning said switch device on and off simultaneously with said power switch.

10. The circuit configuration according to claim 9, wherein said switch device and said resistor are integrated in said power switch.

11. The circuit configuration according to claim 9, wherein said switch device is a MOSFET.

* * * * *